United States Patent [19]

Klein et al.

[11] Patent Number: 4,564,250

[45] Date of Patent: Jan. 14, 1986

[54] EJECTION AND GROUNDING SYSTEM FOR RACK-MOUNTED PLUG-IN MODULES

[75] Inventors: Klaus Klein, Rheinstetten; Reinhard Schmitt, Hagenbach, both of Fed. Rep. of Germany

[73] Assignee: Siemens Aktiengesellschaft, Berlin and Munich, Fed. Rep. of Germany

[21] Appl. No.: 623,277

[22] Filed: Jun. 22, 1984

[51] Int. Cl.$^4$ .............................................. H01R 4/66
[52] U.S. Cl. ............................ 339/14 R; 339/17 M; 361/412
[58] Field of Search ............. 339/17 L, 17 LC, 17 M, 339/14 R, 176 M, 75 M, 75 MP; 361/407, 41 L, 415

[56] References Cited

U.S. PATENT DOCUMENTS

| | | | |
|---|---|---|---|
| 3,170,744 | 2/1965 | Farnsworth | 339/14 R |
| 3,423,719 | 1/1969 | Zaffrann et al. | 339/17 M X |
| 3,470,522 | 9/1969 | Lawrence | 339/14 |
| 3,476,258 | 11/1969 | Dorsett | 339/17 M X |
| 3,853,379 | 12/1974 | Goodman et al. | 339/75 |
| 4,083,616 | 1/1978 | McNiece et al. | 339/14 M |
| 4,243,283 | 1/1981 | McSparran | 339/14 R |
| 4,381,878 | 5/1983 | Lechner et al. | 339/14 R |
| 4,421,372 | 12/1983 | Golden | 339/75 MP |
| 4,484,381 | 11/1984 | Ellis et al. | 24/523 |

FOREIGN PATENT DOCUMENTS 2740684 11/1978 Fed. Rep. of Germany
2844576  4/1980 Fed. Rep. of Germany

OTHER PUBLICATIONS

IBM Technical Disclosure Bulletin, vol. 22, No. 6 (11/1979).

Primary Examiner—Eugene F. Desmond
Attorney, Agent, or Firm—Mark H. Jay

[57] ABSTRACT

An ejection and grounding system for rack-mounted plug-in modules includes an angle lever which bears against a frame element to extract a module mounted in a rack. The frame element contains a buss bar for grounding the modules. A bracket is attached to the module and grounds the module to the buss via an electrically conductive tang; the bracket also supports the angle lever so that it rotates parallel to the module.

2 Claims, 3 Drawing Figures

EJECTION AND GROUNDING SYSTEM FOR RACK-MOUNTED PLUG-IN MODULES

BACKGROUND OF THE INVENTION

The invention relates to systems for installing and removing plug-in modules into and from racks. In, for example, the computer industry it is known to mount groups of electronic components on one or more rigid printed circuit boards to form a module which can then be installed in a rack. It is also known to have the rear edge of the module support plug-in connectors or contacts, which become connected to the back wall of the rack when the module is fully inserted.

When the number of connectors is increased, the force required to join and separate the connectors also increases. This poses particular problems when a module is to be removed from a rack because it is easier to push a module into a rack than to pull it out.

Other requirements exist for systems of this type. One is that the module must be well grounded. This is because such modules are densely packed and parasitic signals may cause interference. Therefore, each module should be grounded using a low impedance and large area connection. Additionally, it is occasionally necessary to mount a connector on the front of a module, and this connector should likewise be well grounded. Additionally, it is sometimes advantageous to shield the entire front edge of a module, and a system of this type should be easily adaptable to modules of varying sizes.

One object of the invention is to provide an ejection and grounding system for rack-mounted plug-in modules which eases removal of an individual module from the rack even if high forces must be applied to the module.

Another object is to provide such a system which provides an excellent ground connection for each module.

Yet another object is to provide such a system which can shield the front of each module after installation.

Yet a further object is to provide such a system in which a connector can easily be installed anywhere on the front of a module, and in which the connector will be well grounded.

Yet another object is to provide a system which can be easily adapted to differently sized modules.

Yet another object of the invention is to generally improve on known devices. Other objects and advantages will become apparent hereinafter.

SUMMARY OF THE INVENTION

In accordance with the invention, there is provided a fixed and elongated frame element which has an elongated recess that is open in front. The recess contains a groundable buss bar.

There is also provided an electrically conductive bracket which is adapted for physical and electrical connection to a module. The bracket has an electrically conductive tang that is connected to the buss bar by being fastened to it using electrically conductive hardware. An angle lever is pivotally secured to the bracket and can be rotated parallel to the module. During rotation, the lever is urged against the frame to extract the module.

This construction ensures that each module is well grounded. It also ensures that the module is easy to remove, since the lever permits large forces to be conveniently applied to separate the module from the rack. Additionally, each individual module can be individually installed and removed without affecting any other module.

Advantageously, there are two parallel frame elements and each of the front corners of a module is attached to a bracket and lever assembly. An electrically conductive strip can be connected between the two brackets to shield the front of the module and also provide a support for any connector which is to be attached to the front of the module.

The invention will be better understood with reference to the following drawings and the detailed description of preferred embodiments.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figure 1:
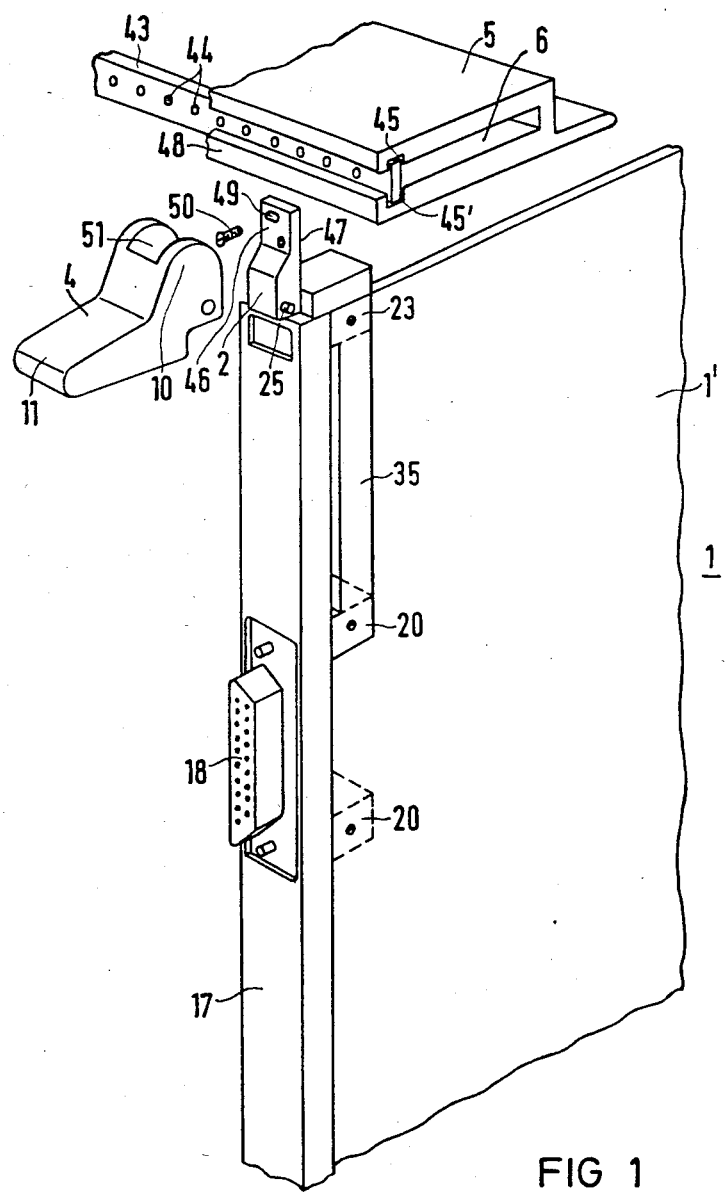
FIG. 1 is an exploded view of an embodiment of the invention.

The same element is always indicated by the same reference numeral in all the Figures.

FIG. 1 shows the front portion of a plug-in module 1. Module 1 consists essentially of a printed circuit board assembly 1' and has a bracket 2 at each of its front corners. The bracket 2 is electrically conductive and is connected to ground on module 1, and has an axle pin 25 for an angle lever generally indicated by reference numeral 4. The lower front corner of the module 1 supports a like assembly, which is the mirror image of the assembly just described.

The module 1 has connectors (not shown) on its back side (not shown) and is inserted lengthwise into grooves (not shown) of a module rack (not shown). The rack has two parallel and elongated frame elements 5 extending normal to the insertion plane of the modules 1. The frame elements 5 each contain a recess 6 which is open toward the front and which contains an elongated buss bar 43 which is used to ground the module 1. The buss bar 43 is preferably copper, and is held in opposed grooves 45, 45' in the frame element 5.

Each of the brackets 2 has a tang 46 which has a passage hole 49. When the module 1 is fully inserted into the rack, the tangs 46 lie against the front of the frame elements 5. In this example, each tang 46 is electrically connected to the buss bar 43 by a screw 50 which is passed through the passage hole 49 and is then threaded into one of a series of tapped holes 44 which are located in the buss bar 43. However, it would be possible for the buss bar 43 to support, e.g. threaded studs; it is not required that screws 50 be used. When a connection between the tang 46 and the buss bar 54 is established by appropriate hardware, the tang 46 can be grounded through the buss bar 43 along a low impedance path.

An angle lever 4 is pivotally secured to the bracket 2 and rotates parallel to the module 1 on the axle pin 25. The angle lever 4 is an integral unit which has a lever arm 11 and a lever arm 10. Lever arm 11 forms a handle.

The lever arm 10 has a surface 52 shaped as a roll-off cam which rides on the front of the frame element 5.

Figure 2:
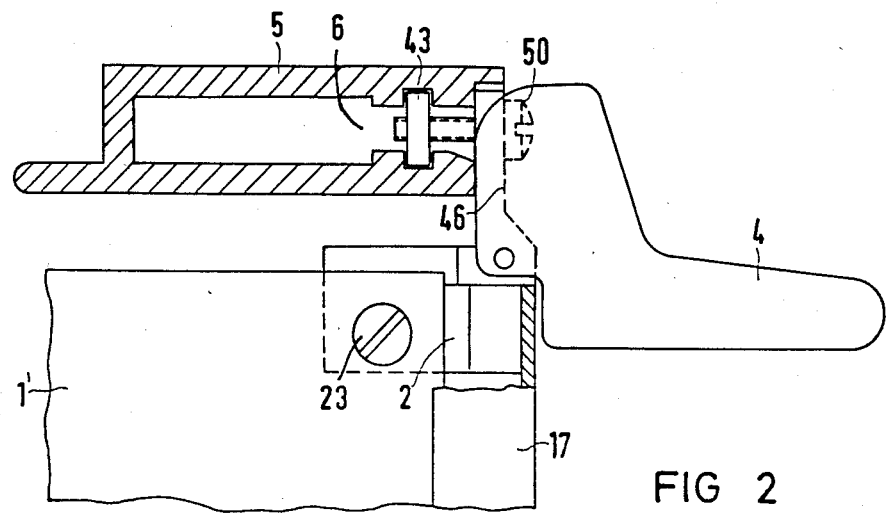
FIG. 2 is a detailed view, partially in section, of the preferred embodiment with a plug-in module installed in a rack.

To lock a module 1 into a plug-in rack, the module is inserted until the position shown in FIG. 2 is reached at the top and bottom of the module 1. Because the angle levers 4 each have a wide space 51 in their lever arms 10, a screwdriver can reach screws 50 to lock the tang 46 (and thus the module 1) in position.

Figure 3:
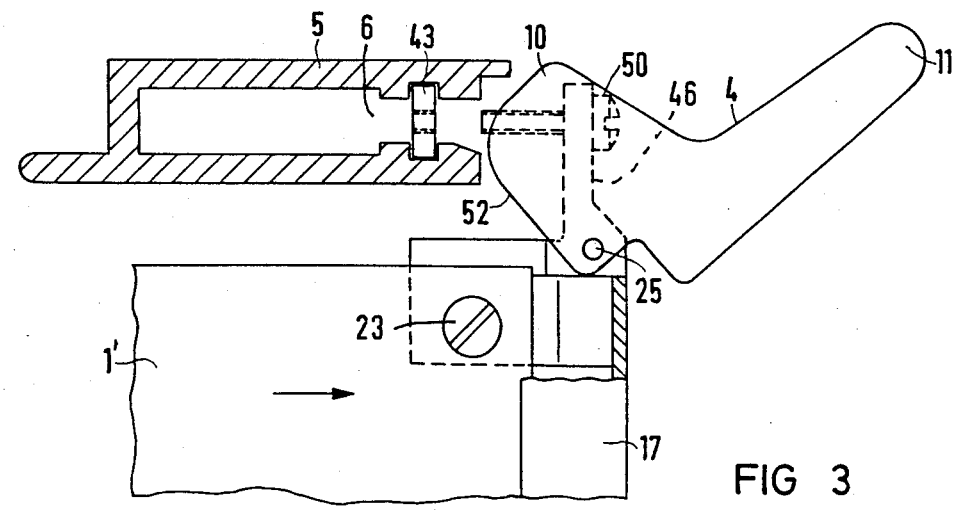
FIG. 3 shows the preferred embodiment with the module partially extracted from the rack.

To remove a module 1, a screwdriver is introduced into each space 51 and each screw 50 is unscrewed. The angle levers 4 are then rotated as shown in FIG. 3, causing the module 1 to be ejected as the surfaces 52 press against the front surface of the frame element 5.

In this example, grounding from the tang 46 is established through the bracket 2 and a conductor track 35. The conductor track 35 is located on the printed circuit board 1' and is connected to the local ground of the board 1'.

The bracket 2 is pressed against the conductor track 35 as by screw 23, which in this example secures the bracket 2 over a front corner of the board 1'. This establishes a ground connection between the tang 46 and the board 1' because the bracket 2 is electrically conductive.

In this example, a connector 18 to which a front plug (not shown) can be attached is mounted on a front strip 17. The connector 18 is fastened in place by two fittings 20 which are mounted to the board 1'. The details of these elements are set out in a commonly-owned U.S. patent application of Bauer, Kessler, Schmitt and Wojtas entitled "Ejection and Grounding System for Rack-Mounted Plug-In Modules" which is filed simultaneously herewith, and to which reference may be had. The angle lever 4 may be equipped with a locking means. This is also disclosed in the above-referenced patent application.

Those skilled in the art will understand that changes can be made in the preferred embodiments here described, and that these embodiments can be used for other purposes. Such changes and uses are within the scope of the invention, which is limited only by the claims which follow.

What is claimed is:

1. An ejection and grounding system for rack-mounted plug-in modules comprising:
   a fixed and elongated frame element having an elongated recess that is open in front;
   a groundable buss bar located in the recess;
   an electrically conductive bracket adaped for physical and electrical connection to a rack-mounted plug-in module, the bracket having an electrically conductive tang for electrical contact with the buss bar using electrically conductive hardware including a screw that is passed through a hole in the tang and threaded into a tapped hole in the buss bar; and
   an angle lever pivotally secured to the bracket and rotatable parallel to the module, the lever having a cammed surface which rides on the frame element when the lever is urged against the frame to extract the module.

2. The system of claim 1, wherein the screw is accessible through a space in the angle lever.

* * * * *